United States Patent
Inagaki (10) Patent No.: US 7,504,973 B2
(45) Date of Patent: Mar. 17, 2009

(54) GAIN-VARIABLE ANALOG/DIGITAL CONVERTER, GAIN ADJUSTMENT METHOD FOR GAIN-VARIABLE ANALOG/DIGITAL CONVERTER, AND SYSTEM INCLUDING GAIN-VARIABLE ANALOG/DIGITAL CONVERTER

(75) Inventor: Yoshitsugu Inagaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 35 days.

(21) Appl. No.: 11/793,043

(22) PCT Filed: Nov. 2, 2005

(86) PCT No.: PCT/JP2005/020203

§ 371 (c)(1),
(2), (4) Date: Jun. 15, 2007

(87) PCT Pub. No.: WO2006/064618

PCT Pub. Date: Jun. 22, 2006

(65) Prior Publication Data

US 2008/0150771 A1  Jun. 26, 2008

(30) Foreign Application Priority Data

Dec. 17, 2004  (JP) ............................. 2004-365243

(51) Int. Cl.
H03M 1/84 (2006.01)
(52) U.S. Cl. ...................................... 341/139; 341/155
(58) Field of Classification Search .................. 341/139, 341/155, 143
See application file for complete search history.

(56) References Cited

U.S. PATENT DOCUMENTS

| | | | | |
|---|---|---|---|---|
| 4,831,378 A | * | 5/1989 | Baars et al. | 341/139 |
| 6,556,163 B2 | * | 4/2003 | Hwang et al. | 341/155 |
| 6,720,902 B2 | * | 4/2004 | Stimmann | 341/159 |
| 7,050,116 B2 | * | 5/2006 | Van Zanten et al. | 348/707 |
| 7,268,714 B2 | * | 9/2007 | Sherry | 341/139 |

FOREIGN PATENT DOCUMENTS

| | | |
|---|---|---|
| JP | 59-104826 | 6/1984 |
| JP | 6-224762 | 8/1994 |
| JP | 2001-275012 | 10/2001 |
| JP | 2002-261610 | 9/2002 |
| JP | 2004-23349 | 1/2004 |

* cited by examiner

Primary Examiner—Peguy JeanPierre
(74) Attorney, Agent, or Firm—Steptoe & Johnson LLP (57) ABSTRACT

Voltage values at a high-voltage side and a low-voltage side of a reference voltage are generated on the basis of a current outputted from a current source circuit having an adjustable current value, and an impedance element having an adjustable impedance value which is connected to an operating amplifier, analog-to-digital conversion is carried out on the basis of the reference voltages, whether gain adjustment for the analog-to-digital conversion is necessary or not is judged according to the conversion result, and the output current of the current source circuit and/or the impedance value of the impedance element are adjusted on the basis of the judgment to adjust the generated voltage values at the high-voltage side and the low-voltage side of the reference voltage. The gain of the analog-to-digital conversion is made variable by adjusting the voltage values at the high-voltage side and the low-voltage side of the reference voltage. Therefore, it is possible to provide a gain-variable analog/digital converter which can maximize the performance of the analog/digital converter, and perform analog signal processing with high efficiency.

9 Claims, 7 Drawing Sheets

GAIN-VARIABLE ANALOG/DIGITAL CONVERTER, GAIN ADJUSTMENT METHOD FOR GAIN-VARIABLE ANALOG/DIGITAL CONVERTER, AND SYSTEM INCLUDING GAIN-VARIABLE ANALOG/DIGITAL CONVERTER

The present application is based on International Application PCT/JP2005/020203, filed Nov. 2, 2005, which claims priority to Japanese Patent Application No. 2004-365243, filed Dec. 17, 2004, the entire contents of which are hereby incorporated by reference.

TECHNICAL FIELD

The present invention relates to an analog/digital converter and a system including an analog/digital converter, and more particularly, to a gain-variable analog/digital converter which is mounted on a semiconductor integrated circuit or a system using a semiconductor integrated circuit, a gain adjustment method for the gain-variable analog/digital converter, and a system including the gain-variable analog/digital converter.

BACKGROUND ART

In an analog signal processing circuit including an analog/digital converter, in order to maximize the performance of the analog/digital converter, an analog signal inputted to the analog signal processing circuit is subjected to amplitude adjustment, and thereafter, input to the analog/digital converter.

As an amplitude adjustment function, a high-performance operating amplifier having a gain varying function has conventionally been adopted. The gain-variable operating amplifier is connected to a front stage of the analog/digital converter, and adjusts the conversion result of the analog/digital converter, or the amplitude of the analog input signal according to need, thereby performing signal processing (e.g., refer to Patent Document 1: Japanese Published Patent Application No. 2001-275012 (Page 5, FIG. 1)).

Figure 7:
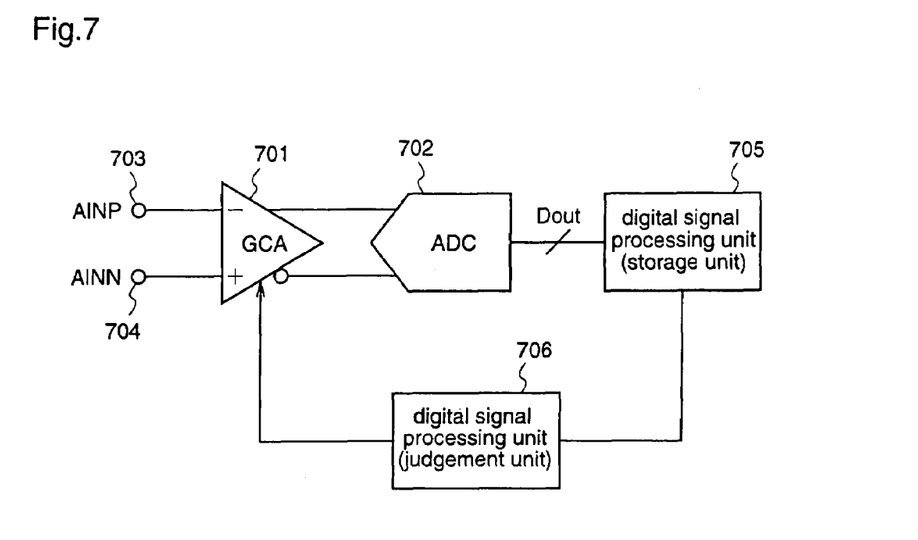
FIG. 7 is a block diagram illustrating a conventional analog/digital converter having a gain varying function.

FIG. 7 is a diagram illustrating the construction of a signal processing circuit including the conventional analog/digital converter having the gain varying function.

With reference to FIG. 7, reference numeral 701 denotes a gain-variable operating amplifier, 702 denotes an analog/digital conversion circuit unit, 703 and 704 denote analog input signal inputting unit, 705 denotes a storage unit, and 706 denotes a judgment unit. The storage unit 705 holds the conversion result of the analog/digital converter 702, and sends a signal to the judgment part 706. The judgment unit 706 judges information such as the amplitude of the analog signal inputted to the analog/digital conversion circuit unit 702, and outputs a signal for performing gain adjustment of the gain-variable operating amplifier 701.

That is, in the construction of the signal processing circuit shown in FIG. 7, the analog signal to be input to the analog/digital conversion circuit unit 702 is amplified by the gain-variable operating amplifier 701, whereby the gain of the analog/digital converter is made variable in the entire circuit.

DISCLOSURE OF THE INVENTION

Problems to be Solved by the Invention

In the above-mentioned conventional construction, however, it is necessary to provide the gain-variable operating amplifier at the front stage of the analog/digital conversion circuit unit to make the gain of the analog/digital converter variable.

Further, since the gain-variable operating amplifier is usually constituted by using a differential amplifier circuit, when the frequency of the analog signal to be input to the analog/digital converter is high, a high-speed and broadband operating amplifier is required. However, in order to operate the operating amplifier at a high speed or broaden the signal band, a large amount of current must be applied to the operating amplifier, leading to an increase in power consumption. At the same time, the size of transistors constituting the operating amplifier must be increased, leading to an increase in the area of the semiconductor integrated circuit. Therefore, the gain-variable operating amplifier is not suitable to a low-power-consumption and low-cost semiconductor integrated circuit which has been demanded in recent years, and a system using the semiconductor integrated circuit.

The present invention is made to solve the above-described problems and has for its object to provide a gain-variable analog/digital converter with reduced power consumption and of the circuit and reduced area, a gain adjustment method for the gain-variable analog/digital converter, and a system including the gain-variable analog/digital converter.

Measures to Solve the Problems

In order to achieve the above-mentioned objects, an analog/digital converter of the present invention comprises a reference voltage generation circuit unit for generating voltage values of reference voltages at a high-voltage side and a low-voltage side, on the basis of a current outputted from a current source circuit and an impedance value of an impedance circuit, which circuits are connected to an operating amplifier; an analog/digital conversion circuit unit for converting an inputted analog signal into a digital signal on the basis of the high-voltage side and low-voltage side voltage values of the reference voltages that are generated by the reference voltage generation circuit unit; and a digital signal processing unit (DSP) for judging whether gain adjustment for the analog/digital conversion is necessary or not on the basis of an output signal from the analog/digital conversion circuit unit, and outputting an output signal for changing the output current of the current source circuit or the impedance value of the impedance circuit when it is judged that gain adjustment is necessary; wherein the output current of the current source circuit or the impedance value of the impedance circuit is changed on the basis of the output signal of the DSP to adjust the high-voltage side or low-voltage side voltage value of the reference voltage that is generated from the reference voltage generation circuit unit, thereby making the gain of the analog/digital conversion variable.

According to the above-mentioned construction, since a difference between the reference voltages at the high-voltage side and the low-voltage side of the analog/digital conversion circuit unit is controlled, gain adjustment for the analog/digital converter can be carried out without connecting a gain-variable operating amplifier to the front stage of the analog/digital conversion circuit unit.

According to the present invention, in the gain-variable analog/digital converter, the current source circuit comprises a digital/analog conversion circuit unit for converting the digital output signal value outputted from the DSP into an analog current, and a current mirror circuit for receiving the current outputted from the digital/analog conversion circuit unit, generating two equal currents, and outputting the currents to a plus input side and a minus input side of the operating amplifier, respectively; and the output current of the digital/analog conversion circuit unit is changed on the basis of the output signal of the DSP to adjust the high-voltage side or low-voltage side voltage value of the reference voltage which is generated from the reference voltage generation circuit unit, thereby making the gain of the analog/digital conversion variable.

According to the above-mentioned construction, since a difference between the reference voltages at the high-voltage side and the low-voltage side of the analog/digital conversion circuit unit is controlled, gain adjustment for the analog/digital converter can be carried out without connecting a gain-variable operating amplifier to the front stage of the analog/digital conversion circuit unit.

According to the present invention, in the gain-variable analog/digital converter, the impedance circuit comprises two impedance element arrays that are connected between input terminals and output terminals of the operating amplifier at the pulse input side and the minus input side, respectively; each of the impedance element arrays comprises an impedance element array comprising plural impedance elements, a switch element array that is connected to the input terminal or the output terminal of the operating amplifier and to one end of the impedance element array, and a switch control circuit for controlling on and off of the respective elements of the switch element array; and the impedance value of the impedance circuit is changed by turning on and off the respective elements of the switch element arrays via the switch control circuit on the basis of the output signal of the DSP to adjust the high-voltage side or low-voltage side voltage value of the reference voltage that is generated from the reference voltage generation circuit unit, thereby making the gain of the analog/digital conversion variable.

According to the above-mentioned construction, since a difference between the reference voltages at the high-voltage side and the low-voltage side of the analog/digital conversion circuit unit is controlled, the gain of the output of the analog/digital converter can be adjusted as a result.

According to the present invention, in the gain-variable analog/digital converter, the current source circuit comprises a digital/analog conversion circuit unit for converting the digital output signal value outputted from the DSP into an analog current, and a current mirror circuit for receiving the current outputted from the digital/analog conversion circuit unit, generating two equal currents, and outputting the currents to the plus input side and the minus input side of the operating amplifier, respectively; the impedance circuit comprises two impedance element arrays that are connected between input terminals and output terminals of the operating amplifier at the pulse input side and the minus input side, respectively; each of the impedance element arrays comprises an impedance element array comprising plural impedance elements, a switch element array that is connected to the input terminal or the output terminal of the operating amplifier and to one end of the impedance element array, and a switch control circuit for controlling on and off of the respective elements of the switch element array; and the impedance value of the impedance circuit is changed by changing the output current of the digital/analog conversion circuit unit or by turning on and off the respective elements of the switch element arrays via the switch control circuit, on the basis of the output signal of the DSP, to adjust the high-voltage side or low-voltage side voltage value of the reference voltage that is generated from the reference voltage generation circuit unit, thereby making the gain of the analog/digital conversion variable.

Also in the above-mentioned construction, since a difference between the reference voltages at the high-voltage side and the low-voltage side of the analog/digital conversion circuit unit is controlled, gain adjustment for the analog/digital converter can be performed without connecting a gain-variable operating amplifier to the front stage of the analog/digital conversion circuit unit.

According to the present invention, in the gain-variable analog/digital converter, the current source circuit comprises two digital/analog conversion circuit units for converting two digital output signal values outputted from the DSP into analog currents, and two current mirror circuits for receiving the currents outputted from the two digital/analog conversion circuit units, each current mirror circuit generating a current, and outputting the current to the plus input side or the minus input side of the operating amplifier; and the output currents from the two digital/analog conversion circuit units are independently changed on the basis of the output signal from the DSP to adjust the high-voltage side or low-voltage side voltage value of the reference voltage that is generated from the reference voltage generation circuit unit, thereby making the gain of the analog/digital conversion variable.

According to the above-mentioned construction, since both of the high-voltage side and the low-voltage side of the reference voltage are individually adjusted, more precise reference voltage adjustment can be achieved, thereby realizing more precise gain adjustment for the analog/digital converter.

According to the present invention, in the gain-variable analog/digital converter, the current source circuit comprises two digital/analog conversion circuit units for converting two digital output signal values outputted from the DSP into analog currents, and two current mirror circuits for receiving the currents outputted from the two digital/analog conversion circuit units, each current mirror circuit generating a current, and outputting the current to the plus input side or the minus input side of the operating amplifier; the impedance circuit comprises two impedance element arrays that are connected between input terminals and output terminals of the operating amplifier at the pulse input side and the minus input side, respectively; each of the impedance element arrays comprises an impedance element array comprising plural impedance elements, a switch element array that is connected to the input terminal or the output terminal of the operating amplifier and to one end of the impedance element array, and a switch control circuit for controlling on and off of the respective elements of the switch element array; and the impedance values of the two impedance element arrays of the impedance circuit are independently changed by changing the output currents of the two digital/analog conversion circuit units or by turning on and off the respective elements of the switch element arrays via the switch control circuit, on the basis of the output signal of the DSP, to adjust the high-voltage side or low-voltage side voltage value of the reference voltage that is generated from the reference voltage generation circuit unit, thereby making the gain of the analog/digital conversion variable.

According to the above-mentioned construction, since both of the high-voltage side and the low-voltage side of the reference voltage are individually adjusted more precisely, gain adjustment for the analog/digital converter can be performed with high precision.

According to the present invention, a gain adjustment method for a gain-variable analog/digital converter comprises a step of generating voltage values of reference voltages at a high-voltage side and a low-voltage side on the basis of a current outputted from a current source circuit and an impedance value of an impedance circuit, which circuits are connected to an operating amplifier; an analog/digital conversion step of converting an inputted analog signal into a digital signal on the basis of the high-voltage side and low-voltage side voltage values of the reference voltages; a judgment step of judging whether gain adjustment for analog/digital conversion is necessary or not on the basis of the conversion result obtained in the conversion step, and outputting an output signal for adjusting the output current of the current source circuit or the impedance value of the impedance circuit when it is judged that gain adjustment is necessary; and a step of changing the output current of the current source circuit or the impedance value of the impedance circuit on the basis of the output signal from the judgment step to adjust the high-voltage side or the low-voltage side voltage value of the generated reference voltage.

According to the above-mentioned construction, gain-variable analog-to-digital conversion can be carried out without connecting a gain-variable operation amplifier to the front stage of the analog/digital conversion circuit unit.

A semiconductor system according to the present invention is provided with a gain-variable analog/digital converter.

According to the above-mentioned construction, it is possible to obtain a system capable of gain adjustment for the analog/digital converter without connecting a gain-variable operating amplifier to the front stage of the analog/digital conversion circuit unit.

A semiconductor system according to the present invention performs gain adjustment for an analog/digital converter by using a gain adjustment method for a gain-variable analog/digital converter.

According to the above-mentioned construction, it is possible to obtain a system capable of gain adjustment for the analog/digital converter without connecting a gain-variable operating amplifier to the front stage of the analog/digital conversion circuit unit.

EFFECTS OF THE INVENTION

According to the present invention, since the gain of the output of the analog/digital converter is adjusted by controlling a difference between the high-voltage side reference voltage and the low-voltage side reference voltage of the analog/digital converter, a gain-variable analog/digital converter with reduced power consumption and reduced cost as well as a system including the gain-variable analog/digital converter can be realized without requiring a high-speed and broadband gain-variable operating amplifier that is conventionally provided at the front stage of the analog/digital conversion circuit.

DESCRIPTION OF REFERENCE NUMERALS

101 . . . analog/digital conversion circuit unit
102,202,302,402,502,602 . . . reference voltage generation circuit unit
103 . . . current source circuit
104 . . . impedance-value variable impedance element
105 . . . differential output type operating amplifier
106 . . . storage unit
107,208,309,409,508,609 . . . judgment unit
203 . . . digital/analog conversion circuit unit
204 . . . impedance-value constant impedance element
206 . . . current mirror circuit outputting two equal currents
303 . . . current-value constant current source circuit
304 . . . impedance-value variable impedance element array
306 . . . switch control circuit
307 . . . switch element array
506 . . . current mirror circuit outputting a current
701 . . . gain-variable type operating amplifier
702 . . . analog/digital conversion circuit unit
703,704 . . . analog signal input

BEST MODE TO EXECUTE THE INVENTION

Hereinafter, embodiments of the present invention will be described with reference to the drawings.

Embodiment 1

First of all, a gain-variable analog/digital converter according to a first embodiment of the present invention and a gain adjustment method thereof will be described with reference to FIG. 1.

Figure 1:
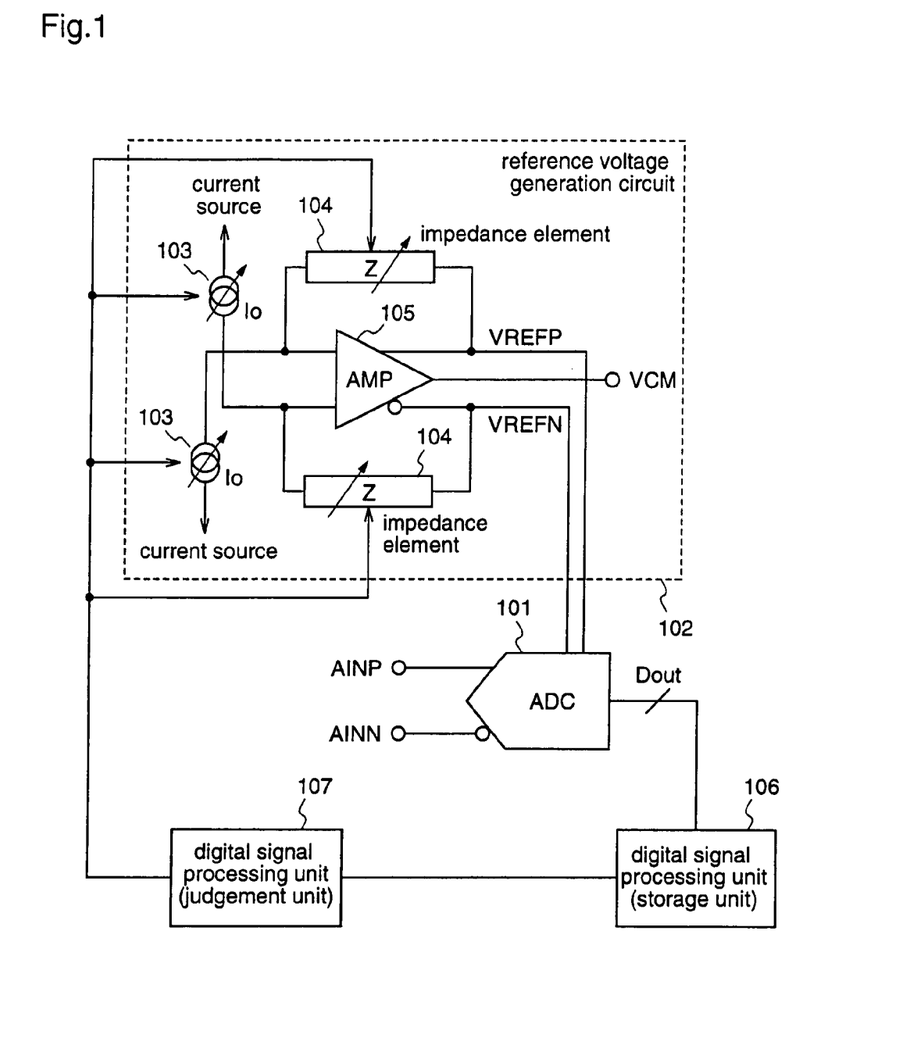
FIG. 1 is a block diagram illustrating a construction of a gain-variable analog/digital converter according to a first embodiment of the present invention.

FIG. 1 is a diagram illustrating the construction of the gain-variable analog/digital converter according to the first embodiment.

As shown in FIG. 1, the gain-variable analog/digital converter according to the first embodiment comprises an analog/digital conversion circuit unit (hereinafter referred to as an ADC) 101, a reference voltage generation circuit unit 102 for generating reference voltages VREFP and VREFN to be input to the ADC 101, a storage unit 106, and a judgment unit 107. Further, the reference voltage generation circuit unit 102 comprises a differential output type operating amplifier 105, positive side and negative side current sources 103 whose current values are adjustable, and positive side and negative side impedance elements 104 whose impedance values are adjustable, which are provided on a plus input side and a minus input side of the operating amplifier 105, respectively.

The ADC 101 converts an inputted analog signal into a digital signal with an output of the reference voltage generation circuit unit 102 being a reference voltage, and outputs the digital signal to a first digital signal processing unit (hereinafter also referred to as a storage unit) 106.

The storage unit 106 holds the conversion result of the ADC 101, and sends a signal to a second digital signal processing unit (hereinafter referred to as a judgment unit) 107.

The judgment unit 107 judges whether gain adjustment should be performed or not, on the basis of the information such as the amplitude of the analog signal inputted to the ADC 101, and outputs a signal for gain adjustment to the respective current sources 103 and the respective impedance elements 104.

Since the operating amplifier 105 is of a differential output type, it has a common mode voltage VCM output terminal.

Next, the gain adjustment method will be described through the operation of the gain-variable analog/digital converter according to the first embodiment which is constructed as described above.

In the reference voltage generation circuit unit 102, since the impedances of the two input terminals on the positive side and the negative side of the operating amplifier 105, to which the respective current sources 103 are connected, are usually very high ($\approx\infty$), the currents from the respective current sources 103 do not flow toward the input terminals.

Therefore, the current which is outputted from each current source 103 according to the output signal of the judgment unit 107 surely flows toward each impedance element 104 that is connected between one input terminal and one output terminal of the operating amplifier 105. Accordingly, assuming that the current value of each current source 103 is Io and the impedance value of each impedance element 104 is Z, a voltage obtained by adding a voltage corresponding to Io×Z to the common mode voltage VCM and a voltage obtained by subtracting the Io×Z from the VCM are outputted to the output terminals on the positive side and the negative side of the operating amplifier 105, i.e., the output terminals on the high-voltage side and the low voltage side to which signals generated by the reference voltage generation circuit unit 102 are to be outputted, respectively.

That is, the reference voltages to be supplied to the ADC 101 are VREFP=VCM+(Io×Z) at the high-voltage side, and VREFN=VCM−(Io×Z) at the low-voltage side.

Thereby, the input range of the analog/digital conversion circuit unit 101 becomes as follows:

$$VREFP-VREFN=VCM+(Io\times Z)-\{VCM-(Io\times Z)\}=2(Io\times Z)$$

As easily seen from the above formula, the input range of the ADC 101 can be changed by adjusting the current value Io of each current source 103 or the resistance value Z of each impedance element 104, thereby controlling the gain.

The high-voltage side and low-voltage side reference voltages generated by the reference voltage generation circuit unit 102 are input to the ADC 101. The ADC 101 outputs the result of conversion to the storage unit 106. The judgment unit 107 receives the output stored in the storage unit 106, and judges the output and information such as amplitudes of the analog signals AINP and AINN inputted to the ADC 101, and outputs signals for adjusting the values of the respective current circuit 103 and/or the respective impedance elements 104 to the respective current sources 103 and/or the respective impedance elements 104.

As described above, the gain-variable analog/digital converter according to the first embodiment of the present invention is provided with the reference voltage generation circuit unit which varies the high-voltage side and low-voltage side reference voltages by adjusting the current values of the current source circuits and/or the impedance values of the impedance elements-according to the output of the analog/digital conversion circuit unit, thereby making the gain of the analog/digital converter variable. Therefore, gain adjustment for the analog/digital converter can be realized without connecting an operating amplifier having a gain varying function to the front stage of the analog/digital conversion circuit unit.

Embodiment 2

Next, a gain-variable analog/digital converter and a gain adjustment method thereof according to a second embodiment of the present invention will be described with reference to FIG. 2.

Figure 2:
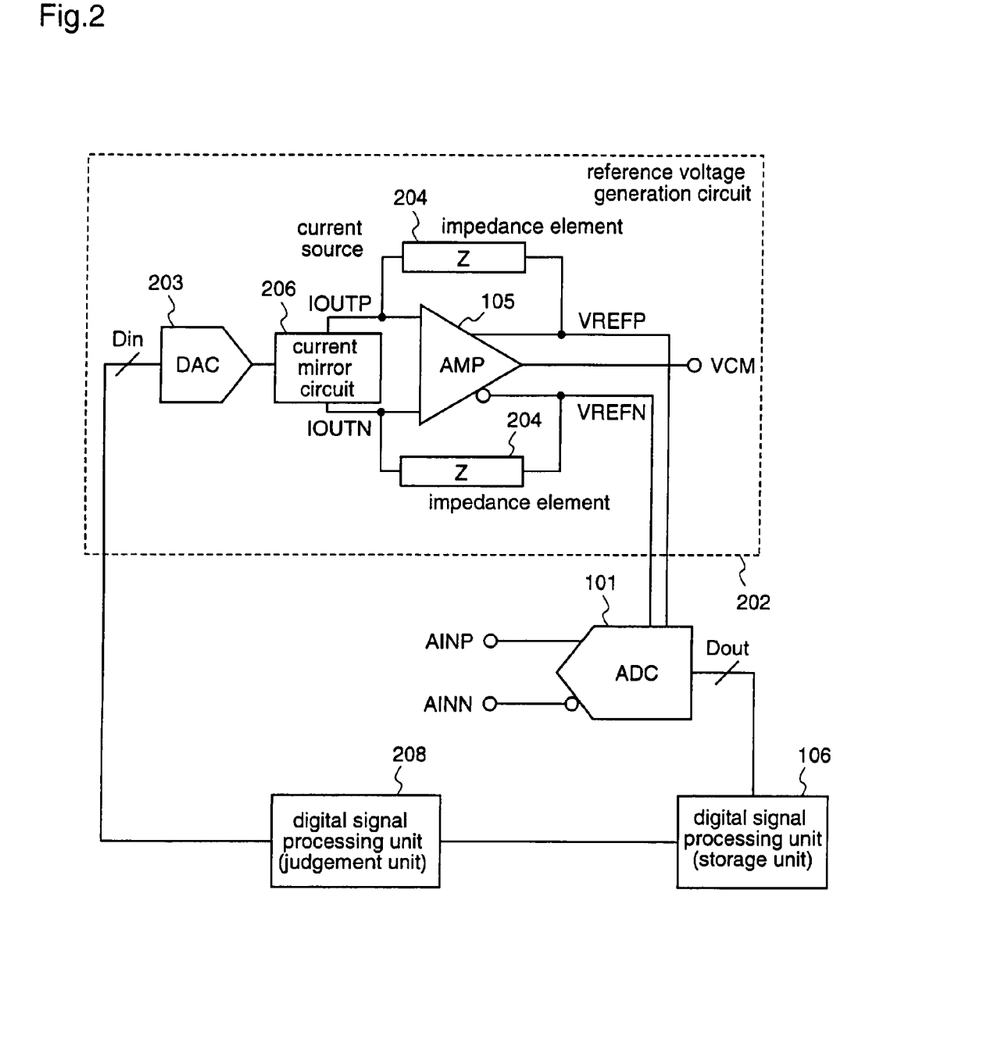
FIG. 2 is a block diagram illustrating a construction of a gain-variable analog/digital converter according to a second embodiment of the present invention.

FIG. 2 is a diagram illustrating the construction of a gain-variable analog/digital converter according to the second embodiment.

As shown in FIG. 2, the gain-variable analog/digital converter according to the second embodiment is provided with an ADC 101, a reference voltage generation circuit unit 202 for generating reference voltages VREFP and VREFN to be input to the ADC 101, a storage unit 106, and a judgment unit 208. Further, the reference voltage generation circuit unit 202 comprises a digital/analog converter circuit unit (hereinafter referred to as a DAC) that is used as a current source, a current mirror circuit 206, an operating amplifier 105, and impedance elements 204 having a constant impedance, which are placed at the plus input side and the minus input side of the operating amplifier 105, respectively.

In this second embodiment, the current source circuits 103 and the impedance elements 104 having variable resistance values according to the first embodiment are replaced with the DAC 203 as a current source, the current mirror circuit 206, and the impedance elements 204 having a constant resistance value. In FIG. 2, the same reference numerals as those shown in FIG. 1 denote the same or corresponding elements, and therefore, repeated description is not necessary.

The judgment unit 208 judges the output of the storage unit 106 and information such as the amplitude of the analog signal inputted to the ADC 101, and outputs a digital input signal Din for performing gain adjustment to the DAC 203.

The DAC 203 converts the digital input signal Din into an analog current.

The current mirror circuit 206 receives an output current from the DAC 203, and outputs currents IOUTP and IOUTN which are consistently equal to each other regardless of the digital input value inputted to the DAC 203, from the current source side to the ground side.

Next, the gain adjustment method will be described through the operation of the gain-variable analog/digital converter according to the second embodiment having the above-mentioned construction.

As in the first embodiment, in the reference voltage generation circuit unit 202 according to the second embodiment, since the impedance of the input terminal of the operating amplifier 105 to which the output of the current mirror circuit 206 is connected is usually very high ($\approx\infty$), the output currents IOUTP and IOUTN from the current mirror circuit 206 do not flow toward the input terminal.

Therefore, the currents outputted from the current mirror circuit 206 surely flow toward the impedance elements 204 which are connected between the input terminals and the output terminals of the operating amplifier 105, respectively. Accordingly, assuming that the current values from the current mirror circuit 206 are IOUTP and IOUTN as described above and the resistance value of each impedance element is Z, a voltage that is obtained by adding a voltage corresponding to IOUTP×Z to the common mode voltage VCM and a voltage that is obtained by subtracting a voltage corresponding to IOUTN×Z from the VCM are outputted to the output terminals of the operating amplifier 105, i.e., the output terminals on the high-voltage side and the low-voltage side to which signals generated by the reference voltage generation circuit unit 202 are to be outputted, respectively.

That is, the reference voltages to be supplied to the ADC 101 are VREFP=VCM+(IOUTP×Z) at the high-voltage side, and VREFN=VCM−(IOUTN×Z) at the low-voltage side.

Therefore, the input range of the analog/digital conversion circuit unit 101 becomes as follows:

VREFP−VREFN=VCM+(IOUTP×Z)−{VCM−(IOUTN×Z)}=(IOUTP+IOUTN)×Z

As easily seen from the above formula, the input range of the ADC 101 can be adjusted by adjusting the current values IOUTP and IOUTN of the current mirror circuit 206, thereby controlling the gain.

The high-voltage side and low-voltage side reference voltages outputted from the reference voltage generation circuit unit 202 are input to the ADC 101. The ADC 101 converts the inputted analog signals AINP and AINN on the basis of the high-voltage side and low-voltage side reference voltages, and outputs the conversion result to the storage unit 106. The conversion result is stored in the storage unit 106. The judgment unit 208 receives the output stored in the storage unit 106, and judges as to whether gain adjustment is necessary or not on the basis of the output and information such as the amplitudes of the analog signals inputted to the ADC 101, and outputs a signal for adjusting the analog output current of the DAC 203.

As described above, the analog output current from the DAC 203 and the current values IOUTP and IOUTN outputted from the current mirror circuit 206 can be adjusted by changing the value of the digital input signal Din of the DAC 203, according to the signal from the judgment unit 208.

That is, the current values that flow into the impedance elements 204 can be precisely controlled, and further, even when the impedance elements 204 are constituted such that the impedance values thereof are fixed, i.e., unadjustable, since the values of the high-voltage side and low-voltage side reference voltages VREFP and VREFN outputted from the reference voltage generation circuit unit 202 can be varied, the gain of the ADC 101 can be made variable.

As described above, the gain-variable analog/digital converter according to the second embodiment of the present invention is provided with the reference voltage generation circuit unit which varies the high-voltage side and low-voltage side reference voltages by adjusting the output current from the DAC 203 and then the currents that flow into the impedance elements, according to the output of the ADC 101, thereby making the gain of the analog/digital converter variable. Therefore, gain adjustment for the analog/digital converter can be realized without connecting an operating amplifier having a gain varying function to the front stage of the analog/digital conversion circuit unit.

Embodiment 3

Next, a gain-variable analog/digital converter and a gain adjustment method thereof according to a third embodiment of the present invention will be described with reference to FIG. 3.

Figure 3:
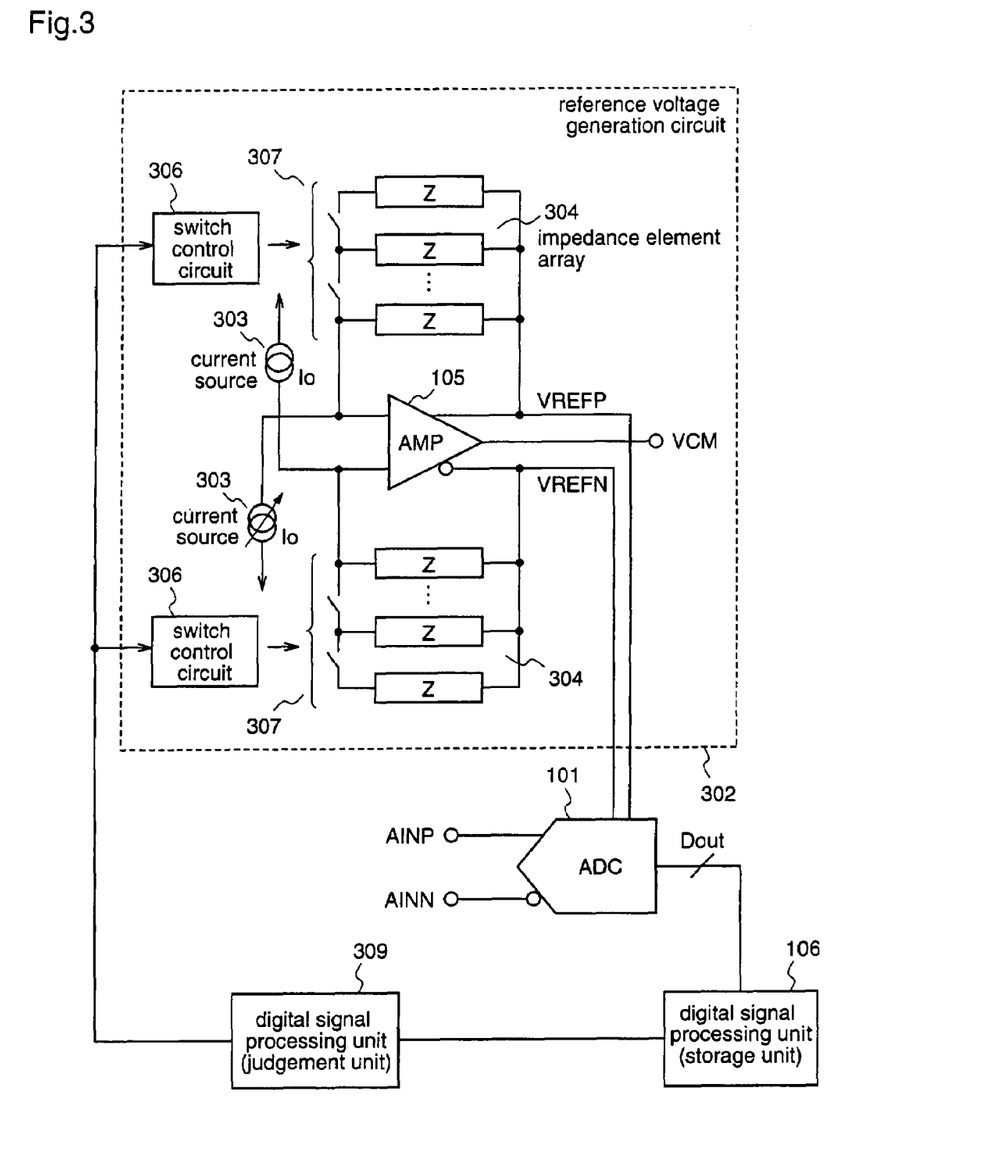
FIG. 3 is a block diagram illustrating a construction of a gain-variable analog/digital converter according to a third embodiment of the present invention.

FIG. 3 is a diagram illustrating the construction of the gain-variable analog/digital converter according to the third embodiment.

As shown in FIG. 3, the gain-variable analog/digital converter according to the third embodiment comprises an ADC 101, a storage unit 106, a reference voltage generation circuit unit 302 for generating reference voltages VREFP and VREFN to be input to the ADC 101, and a judgment unit 309. Further, the reference voltage generation circuit unit 302 comprises an operating amplifier 105, current sources 303 having a constant current value, and impedance circuits, which are respectively disposed on the plus input side and the minus input side of the operating amplifier 105. Each impedance circuit comprises an impedance element array 304 which is selectively connectable by a switch element array 307, and a switch control circuit 306 for controlling on and off of the switch element array 307 connected to the impedance element array 304.

In FIG. 3, the same reference numerals as those shown in FIG. 1 denote the same or corresponding elements, and therefore, repeated description is not necessary.

Next, the gain adjustment method will be described through the operation of the gain-variable analog/digital converter according to the third embodiment having the above-mentioned construction.

The output value (conversion result) of the ADC 101 is sent to the storage unit 106 and stored in it. Next, the stored result is sent to the judgment unit 309.

The judgment unit 309 judges whether gain adjustment is necessary or not, on the basis of the output from the storage unit 106 and information such as the amplitudes of analog signals inputted to the ADC 101, and outputs a signal for gain adjustment to the respective switch control circuits 306.

The switch control circuits 306 control on and off the switch element arrays 307 according to the output signal from the judgement unit 309, thereby controlling the impedance values of the impedance circuits, i.e., the impedance element arrays 304.

That is, also in this third embodiment, the high-voltage side and low-voltage side reference voltage values that are supplied from the reference voltage generation circuit unit 302 to the ADC 101 are determined by the impedance circuits and the current sources 303. Further, in the impedance circuits, the switches 307 are turned on or off according to need by the switch control circuits 306, thereby varying the impedance values thereof, i.e., the impedance values of the impedance element arrays 304.

Accordingly, as in the first embodiment, the high-voltage side reference voltage VREFP=VCM+(Io×Z) and the low-voltage side reference voltage VREFN=VCM−(Io×Z), which are generated by the reference voltage generation circuit unit 302, are determined by Io×Z. That is, even when the values of the current sources Io are constant, the reference voltage values can be varied by varying Z.

As described above, the gain-variable analog/digital converter according to the third embodiment of the present invention is provided with the reference voltage generation circuit unit which varies the high-voltage side and low-voltage side reference voltages by turning on or off the switch element arrays 307 according to the output of the ADC 101 and then adjusting the impedance values of the impedance element arrays 304, thereby making the gain of the analog/digital converter variable. Therefore, gain adjustment for the analog/digital converter is realized without connecting an operating amplifier having a gain varying function to the front stage of the analog/digital conversion circuit unit.

Embodiment 4

Next, a gain-variable analog/digital converter and a gain adjustment method thereof according to a fourth embodiment of the present invention will be described with reference to FIG. 4.

Figure 4:
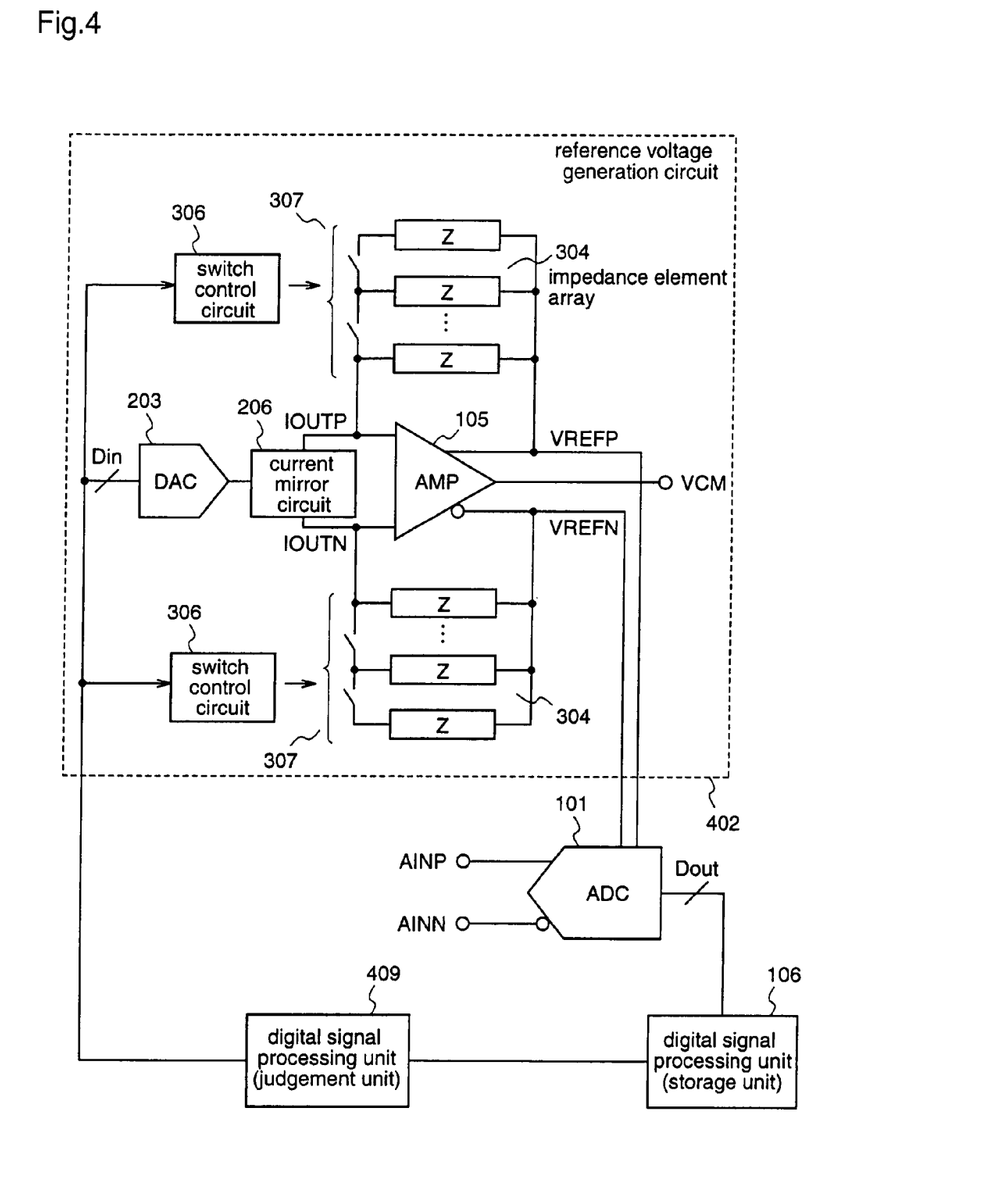
FIG. 4 is a block diagram illustrating a construction of a gain-variable analog/digital converter according to a fourth embodiment of the present invention.

FIG. 4 is a diagram illustrating the construction of the gain-variable analog/digital converter according to the fourth embodiment.

As shown in FIG. 4, the gain-variable analog/digital converter according to the fourth embodiment comprises an ADC 101, a storage unit 106, a reference voltage generation circuit unit 402 for generating reference voltages VREFP and VREFN to be input to the ADC 101, and a judgment unit 409. Further, the reference voltage generation circuit unit 402 comprises an operating amplifier 105, a DAC 203 used as a current source, a current mirror circuit 206, and two impedance circuits which are respectively disposed on the plus input side and the minus input side of the operating amplifier 105. Further, each impedance circuit comprises an impedance element array 304 that is selectively connectable by a switch element array 307, and a switch control circuit 306 for performing switching, i.e., on/off control, of the switch element array 307 connected to the impedance element array 304.

In FIG. 4, the same reference numerals as those shown in FIGS. 1 to 3 denote the same or corresponding constituents, and therefore, repeated description is not necessary.

Next, the operation of the gain-variable analog/digital conversion according to the fourth embodiment will be described.

An output of the ADC 101 is input to the storage unit 106, wherein the result of analog/digital conversion result is stored. The stored analog/digital conversion result is sent to the judgment unit 409. The judgment unit 409 judges whether gain adjustment is necessary or not, on the basis of the output from the storage unit 106 and information such as the amplitudes of analog signals inputted to the ADC 101, and then outputs an input signal Din of the DAC 203 and a control signal for controlling each switch control circuit 306 that controls on and off of each switch element array 307.

A current that is outputted from the DAC 203 according to the input signal Din is input to the current mirror circuit 206, and currents IOUTP and IOUTN outputted from the current mirror circuit 206 are input to the impedance element arrays 304 and to the operating amplifier 105.

Further, the switch control circuit 306 turns on or off the individual elements of the switch element array 307 according to the control signal from the judgment unit 409, thereby changing the impedance value of the impedance circuit, i.e., the impedance element array 304.

That is, also in this fourth embodiment, the high-voltage side and low-voltage side reference voltages which are supplied from the reference voltage generation circuit unit 402 to the ADC 101 are determined by the impedance values of the impedance element arrays 304, and the output current from the DAC 203, and further, the output currents from the current mirror circuit 206.

Accordingly, as in the second embodiment, the reference voltages generated by the reference voltage generation circuit unit 402 are VREFP=VCM+(IOUTP×Z) at the high-voltage side and VREFN=VCM−(IOUTN×Z) at the low-voltage side, respectively. That is, since the input range of the ADC 101 is determined by (IOUTP+IOUTN)×Z, the reference voltage values can be varied by changing the value of Z even if the value of the current source (IOUTP+IOUTN) does not change.

Of course, in the construction of the fourth embodiment, the reference voltage values can be varied similarly by changing only the value of (IOUTP+IOUTN) or by changing both the value of (IOUTP+IOUTN) and the value of Z.

As described above, the gain-variable analog/digital converter according to the fourth embodiment of the present invention is provided with the reference voltage generation circuit unit which varies the high-voltage side and low-voltage side reference voltages by turning on and off the switch element arrays 307 and then controlling the impedance values of the impedance element arrays 304, thereby making the gain of the analog/digital converter variable. Therefore, gain control for the analog/digital converter can be realized without connecting an operating amplifier having a gain varying function to the front stage of the analog/digital conversion circuit unit.

Embodiment 5

Next, a gain-variable analog/digital converter according to a fifth embodiment of the present invention and a gain adjustment method thereof will be described with reference to FIG. 5.

Figure 5:
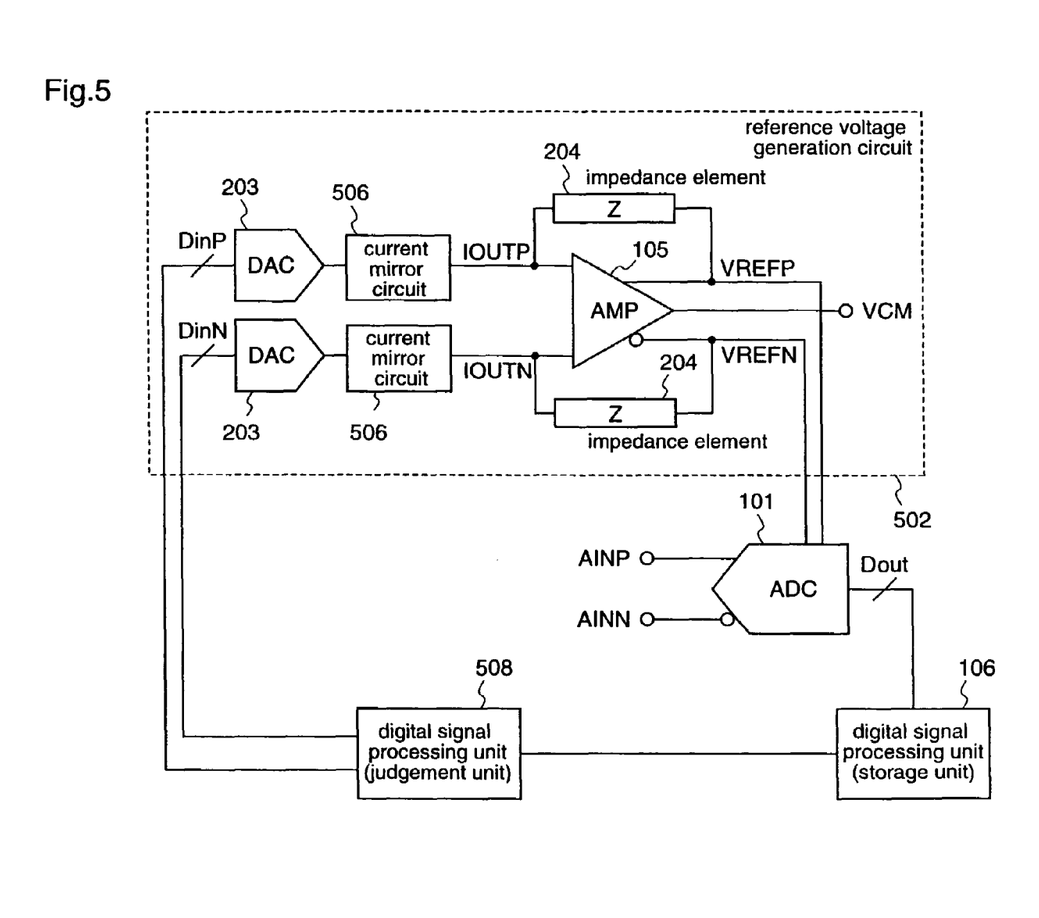
FIG. 5 is a block diagram illustrating a construction of a gain-variable analog/digital converter according to a fifth embodiment of the present invention.

FIG. 5 is a diagram illustrating the construction of the gain-variable analog/digital converter according to the fifth embodiment.

With reference to FIG. 5, the gain-variable analog/digital converter according to the fifth embodiment is provided with an ADC 101, a storage unit 106, a reference voltage generation circuit unit 502 for generating reference voltages VREFP and VREFN to be input to the ADC 101, and a judgment unit 508. The reference voltage generation circuit unit 502 is provided with an operating amplifier 105, DACs 203 used as current sources, current mirror circuits 506, and impedance elements 204 having a constant resistance value, which are disposed at the plus input side and the minus input side of the operating amplifier 105, respectively.

The current mirror circuits 506 output currents according to digital values that are inputted to the DACs 203 connected to the circuits.

In FIG. 5, the same constituents as those shown in FIGS. 1 and 2 are denoted by the same reference numerals to omit the description thereof.

Next, the gain adjustment method will be described through the operation of the gain-variable analog/digital converter according to the fifth embodiment having the above-mentioned construction.

The ADC 101 converts an inputted analog signal into a digital signal on the basis of the high-voltage side and low-voltage side reference voltages that are outputted from the reference voltage generation circuit 502, and outputs the result of conversion to the storage unit 106. The analog/digital conversion result is stored in the storage unit 106. The stored analog/digital conversion result is further sent to the judgment unit 508, and the judgment unit 508 judges whether gain adjustment is necessary or not, on the basis of the output from the storage unit 106 and information such as the amplitude of the analog signal inputted to the ADC 101, and outputs appropriate digital input values DinP and DinN to a pair of DACs 203.

On the plus input side of the operating amplifier 105, the DAC 203 outputs an output current according to the digital input value DinP to the current mirror circuit 506. Then, the current mirror circuit 506 outputs a current IOUTP according to the output current of the DAC 203 from the power supply side to the ground side.

Likewise, on the minus input side of the operating amplifier 105, the DAC 203 outputs an output current according to the digital input value DinN to the current mirror circuit 506. The current mirror circuit 506 outputs a current IOUTN according to the output current of the DAC 203 from the power supply side to the ground side.

That is, also in this fifth embodiment, the high-voltage side and low-voltage side reference voltage values to be supplied from the reference voltage generation circuit unit 502 to the ADC 101 are determined by the impedance values of the impedance elements 204 and the output currents from the DACs 203, i.e., the output currents IOUTP and IOUTN from the current mirror circuits 206.

Accordingly, as in the second embodiment, the reference voltages generated by the reference voltage generation circuit unit 502 are VREFP=VCM+(IOUTP×Z) at the high voltage side and VREFN=VCM−(IOUTN×Z) at the low voltage side, respectively. That is, since the input range of the ADC 101 is determined by (IOUTP+IOUTN)×Z, the reference voltage values can be varied by varying the value of the current source (IOUTP+IOUTN).

As described above, the current values IOUTP and IOUTN outputted from the current mirror circuits 506 can be independently adjusted by independently varying the values of the digital input signals DinP and DinN to the pair of DACs 203 according to the signal from the judgment unit 508. Thereby, the high-voltage side and low-voltage side reference voltages generated by the reference voltage generation circuit can be independently varied.

As described above, the gain-variable analog/digital converter according to the fifth embodiment of the present invention is provided with the reference voltage generation circuit unit which varies the high-voltage side and low-voltage side reference voltages by adjusting the output currents from the pair of DACs 203 independently from each other according to the output of the ADC 101, thereby making the gain of the analog/digital converter variable. Therefore, gain adjustment for the analog/digital converter can be precisely realized without connecting an operating amplifier having a gain varying function to the front stage of the analog/digital conversion circuit unit.

Embodiment 6

Next, a gain-variable analog/digital converter and a gain adjustment method thereof according to a sixth embodiment of the present invention will be described with reference to FIG. 6.

Figure 6:
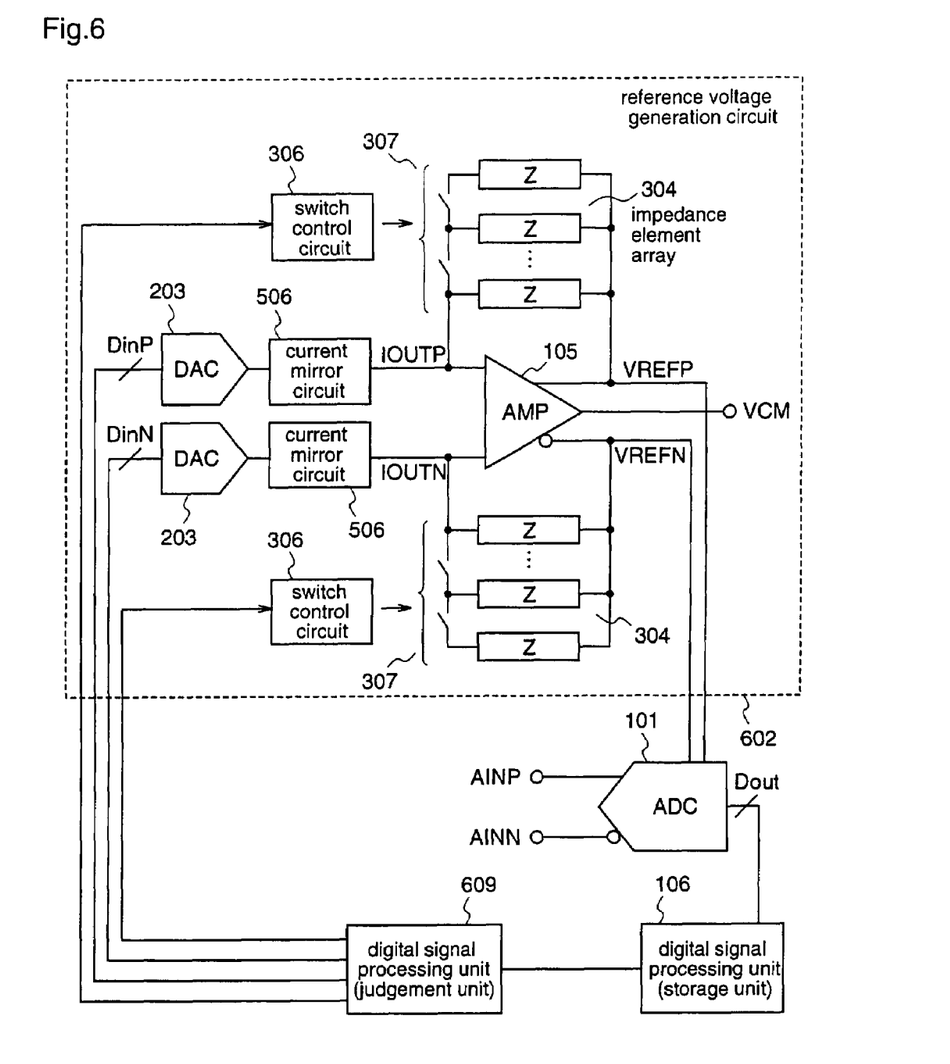
FIG. 6 is a block diagram illustrating a construction of a gain-variable analog/digital converter according to a sixth embodiment of the present invention.

FIG. 6 is a block diagram illustrating the construction of the gain-variable analog/digital converter according to the sixth embodiment.

In this sixth embodiment, the impedance elements 204 having a constant resistance value according to the fifth embodiment are replaced with impedance circuits comprising impedance element arrays 304 that are selectively connectable by switch element arrays 307, and switch control circuits 306 for controlling on and off of the respective elements in the switch element arrays 307. The switch control circuits 306 can control the impedance element arrays 304 that are connected to the plus input side and the minus input side of the operating amplifier 105, respectively.

In FIG. 6, the same or corresponding constituents as/to those shown in FIGS. 1 to 5 are denoted by the same reference numerals to omit the description thereof.

Next, the gain adjustment method will be described through the operation of the gain-variable analog/digital converter of the sixth embodiment having the above-mentioned construction.

The analog/digital conversion result outputted from the ADC 101 is input to the storage unit 106 to be stored therein. The stored conversion result is sent to the judgment unit 609, and the judgement unit 609 judges as to whether gain adjustment is necessary or not, on the basis of the output from the storage unit 106, and information such as the amplitude of the analog signal inputted to the ADC 101, and outputs appropriate digital input values DinP and DinN to the two DACs 203, and appropriate controls signals to the two switch control circuits 306 which control on and off of the two switch element arrays 307, respectively.

On the plus input side and the minus input side of the operating amplifier 105, the current values that are outputted from the DACs 203 according to the digital input values DinP and DinN are inputted to the current mirror circuits 506, and then inputted to the impedance element arrays 304, respectively.

The switch control circuit 306 turns on or off the respective elements in the switch element array 307 according to the control signal from the judgment unit 409, thereby varying the impedance value of the impedance element array 304.

That is, also in this sixth embodiment, the high-voltage side and low-voltage side reference voltage values supplied from the reference voltage generation circuit unit 602 to the ADC 101 are determined by the impedance values of the impedance element arrays 304 of the impedance circuits, and the output currents from the DACs 203, i.e., the output currents IOUTP and IOUTN from the current mirror circuits 206.

Therefore, as in the fifth embodiment, the reference voltages generated by the reference voltage generation circuit unit 602 are VREFP=VCM+(IOUTP×Zp) at the high-voltage side and VREFN=VCM−(IOUTN×Zn) at the low-voltage side, respectively. That is, since the input range of the ADC 101 is determined by (IOUTP×Zp+IOUTN×Zn), the reference voltage values can be varied by changing either of IOUTP and IOUTN, or Zp and Zn. Here, Zp and Zn are the impedance values of the impedance element arrays on the plus input side and the minus input side of the operating amplifier 105, respectively.

As described above, the values of the digital input signals DinP and DinN to the DACs 203 are independently varied according to the signal from the judgment unit 609, whereby the current values IOUTP and IOUTN outputted from the current mirror circuits 506 can be adjusted independently from each other. At the same time, the switch control circuits 306 turn on or off the switch element arrays 307 according to the signal from the judgment unit 609, whereby the impedance values Zp and Zn of the impedance element arrays 304 can be adjusted independently from each other. Thereby, the high-voltage side and low-voltage side reference voltages to be supplied to the ADC 101 can be varied independently from each other.

Accordingly, the gain-variable analog/digital converter according to the sixth embodiment can realize gain adjustment for the analog/digital converter with higher accuracy relative to the above-mentioned fifth embodiment, without connecting an operating amplifier having a gain varying function to the front stage of the analog/digital conversion circuit unit.

Further, a semiconductor system equipped with the gain-variable analog/digital converter according to any of the first to sixth embodiments or a semiconductor system using the above-mentioned gain adjustment method for the gain-variable analog/digital converter does not require an operating amplifier having a gain varying function at the front stage of the analog/digital converter circuit unit, and therefore, the system provides the merits such as low power consumption and low cost.

APPLICABILITY IN INDUSTRY

An analog/digital converter according to the present invention is able to adjust the gain of the analog/digital converter without connecting a high-performance gain-variable operating amplifier to the front stage thereof, and therefore, it is applicable to a semiconductor integrated circuit for which low power consumption and low cost are demanded, such as mobile equipment or video equipment, and to a system using the circuit.

The invention claimed is:

1. A gain-variable analog/digital converter comprising:
a reference voltage generation circuit unit for generating voltage values of reference voltages at a high-voltage side and a low-voltage side, on the basis of a current outputted from a current source circuit and an impedance value of an impedance circuit, which circuits are connected to an operating amplifier;
an analog/digital conversion circuit unit for converting an inputted analog signal into a digital signal on the basis of the high-voltage side and low-voltage side voltage values of the reference voltages that are generated by the reference voltage generation circuit unit; and
a digital signal processing unit (DSP) for judging whether gain adjustment for the analog/digital conversion is necessary or not on the basis of an output signal from the analog/digital conversion circuit unit, and outputting an output signal for changing the output current of the current source circuit or the impedance value of the impedance circuit when it is judged that gain adjustment is necessary;
wherein the output current of the current source circuit or the impedance value of the impedance circuit is changed on the basis of the output signal of the DSP to adjust the high-voltage side or low-voltage side voltage value of the reference voltage that is generated from the reference voltage generation circuit unit, thereby making the gain of the analog/digital conversion variable.

2. A gain-variable analog/digital converter as defined in claim 1 wherein said current source circuit comprises:
a digital/analog conversion circuit unit for converting the digital output signal value outputted from the DSP into an analog current; and
a current mirror circuit for receiving the current outputted from the digital/analog conversion circuit unit, generating two equal currents, and outputting the currents to a plus input side and a minus input side of the operating amplifier, respectively;
wherein the output current of the digital/analog conversion circuit unit is changed on the basis of the output signal of the DSP to adjust the high-voltage side or low-voltage side voltage value of the reference voltage which is generated from the reference voltage generation circuit unit, thereby making the gain of the analog/digital conversion variable.

3. A gain-variable analog/digital converter as defined in claim 1 wherein said impedance circuit comprises two impedance element arrays that are connected between input terminals and output terminals of the operating amplifier at the pulse input side and the minus input side, respectively;
each of the impedance element arrays comprises
an impedance element array comprising plural impedance elements,
a switch element array that is connected to the input terminal or the output terminal of the operating amplifier and to one end of the impedance element array, and
a switch control circuit for controlling on and off of the respective elements of the switch element array; and
the impedance value of the impedance circuit is changed by turning on and off the respective elements of the switch element arrays via the switch control circuit on the basis of the output signal of the DSP to adjust the high-voltage side or low-voltage side voltage value of the reference voltage that is generated from the reference voltage generation circuit unit, thereby making the gain of the analog/digital conversion variable.

4. A gain-variable analog/digital converter as defined in claim 1 wherein
said current source circuit comprises:
a digital/analog conversion circuit unit for converting the digital output signal value outputted from the DSP into an analog current; and
a current mirror circuit for receiving the current outputted from the digital/analog conversion circuit unit, generating two equal currents, and outputting the currents to the plus input side and the minus input side of the operating amplifier, respectively;
said impedance circuit comprises two impedance element arrays that are connected between input terminals and output terminals of the operating amplifier at the pulse input side and the minus input side, respectively;
each of the impedance element arrays comprises
an impedance element array comprising plural impedance elements,
a switch element array that is connected to the input terminal or the output terminal of the operating amplifier and to one end of the impedance element array, and
a switch control circuit for controlling on and off of the respective elements of the switch element array; and
the impedance value of the impedance circuit is changed by changing the output current of the digital/analog conversion circuit unit or by turning on and off the respective elements of the switch element arrays via the switch control circuit, on the basis of the output signal of the DSP, to adjust the high-voltage side or low-voltage side voltage value of the reference voltage that is generated from the reference voltage generation circuit unit, thereby making the gain of the analog/digital conversion variable.

5. A gain-variable analog/digital converter as defined in claim 1 wherein said current source circuit comprises:
two digital/analog conversion circuit units for converting two digital output signal values outputted from the DSP into analog currents, and
two current mirror circuits for receiving the currents outputted from the two digital/analog conversion circuit units, each current mirror circuit generating a current, and outputting the current to the plus input side or the minus input side of the operating amplifier;
wherein the output currents from the two digital/analog conversion circuit units are independently changed on the basis of the output signal from the DSP to adjust the high-voltage side or low-voltage side voltage value of the reference voltage that is generated from the reference voltage generation circuit unit, thereby making the gain of the analog/digital conversion variable.

6. A gain-variable analog/digital converter as defined in claim 1 wherein said current source circuit comprises:
two digital/analog conversion circuit units for converting two digital output signal values outputted from the DSP into analog currents; and
two current mirror circuits for receiving the currents outputted from the two digital/analog conversion circuit units, each current mirror circuit generating a current, and outputting the current to the plus input side or the minus input side of the operating amplifier;
said impedance circuit comprises two impedance element arrays that are connected between input terminals and output terminals of the operating amplifier at the pulse input side and the minus input side, respectively;

each of the impedance element arrays comprises
an impedance element array comprising plural impedance elements,
a switch element array that is connected to the input terminal or the output terminal of the operating amplifier and to one end of the impedance element array, and
a switch control circuit for controlling on and off of the respective elements of the switch element array; and the impedance values of the two impedance element arrays of the impedance circuit are independently changed by changing the output currents of the two digital/analog conversion circuit units or by turning on and off the respective elements of the switch element arrays via the switch control circuit, on the basis of the output signal of the DSP, to adjust the high-voltage side or low-voltage side voltage value of the reference voltage that is generated from the reference voltage generation circuit unit, thereby making the gain of the analog/digital conversion variable.

7. A gain adjustment method for a gain-variable analog/digital converter, said method comprising:
a step of generating voltage values of reference voltages at a high-voltage side and a low-voltage side on the basis of a current outputted from a current source circuit and an impedance value of an impedance circuit, which circuits are connected to an operating amplifier;
an analog/digital conversion step of converting an inputted analog signal into a digital signal on the basis of the high-voltage side and low-voltage side voltage values of the reference voltages;
a judgment step of judging whether gain adjustment for analog/digital conversion is necessary or not on the basis of the conversion result obtained in the conversion step, and outputting an output signal for adjusting the output current of the current source circuit or the impedance value of the impedance circuit when it is judged that gain adjustment is necessary; and
a step of changing the output current of the current source circuit or the impedance value of the impedance circuit on the basis of the output signal from the judgment step to adjust the high-voltage side or the low-voltage side voltage value of the generated reference voltage.

8. A semiconductor system provided with a gain-variable analog/digital converter as defined in claim 1.

9. A semiconductor system performing gain adjustment for an analog/digital converter by using a gain adjustment method for a gain-variable analog/digital converter as defined in claim 7.

* * * * *